(12) United States Patent
Sekiya

(10) Patent No.: US 12,080,564 B2
(45) Date of Patent: Sep. 3, 2024

(54) PACKAGE SUBSTRATE PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

(*) Notice: Subject to any disclaimer, the term of this patent is extended or adjusted under 35 U.S.C. 154(b) by 402 days.

(21) Appl. No.: 17/657,842

(22) Filed: Apr. 4, 2022

(65) Prior Publication Data
US 2022/0336232 A1   Oct. 20, 2022

(30) Foreign Application Priority Data

Apr. 15, 2021  (JP) .................................. 2021-069360

(51) Int. Cl.
*H01L 21/56* (2006.01)
*H01L 21/48* (2006.01)

(52) U.S. Cl.
CPC ........ *H01L 21/561* (2013.01); *H01L 21/4853* (2013.01); *H01L 21/565* (2013.01)

(58) Field of Classification Search
CPC . H01L 21/561; H01L 21/4853; H01L 21/565; H01L 23/562; H01L 2221/68331; H01L 21/4842; H01L 21/6835; H01L 23/3107; H01L 23/49548; H01L 23/49582; H01L 23/49541; H01L 21/3065; H01L 21/67069; H01L 21/67092; H01L 21/67132; H01L 21/78–786; H01L 21/3043; H01L 24/97; H01L 2224/97; H01L 24/96; H01L 2224/96
See application file for complete search history.

(56) References Cited

U.S. PATENT DOCUMENTS

2016/0035635 A1* 2/2016 Tanaka .................... H01L 21/78
                                                                    438/7

FOREIGN PATENT DOCUMENTS

JP          2018206995 A       12/2018

* cited by examiner

*Primary Examiner* — Mohammad A Rahman
(74) *Attorney, Agent, or Firm* — Greer Burns & Crain Ltd.

(57) ABSTRACT

A package substrate processing method includes a holding step of holding a package substrate by a chuck table, a warp reducing step of, after the holding step is performed, reducing a warp in the package substrate by forming grooves of a first depth along planned dividing lines of the package substrate by using a first cutting blade, a groove forming step of forming grooves of, after the warp reducing step is performed, a second depth by further cutting the grooves of the first depth by using the first cutting blade, and a dividing step of, after the groove forming step is performed, forming packaged chips by further cutting the grooves of the second depth and thus dividing the package substrate by using a second cutting blade thinner than the first cutting blade.

3 Claims, 12 Drawing Sheets

PACKAGE SUBSTRATE PROCESSING METHOD

BACKGROUND OF THE INVENTION

Field of the Invention

The present invention relates to a package substrate processing method.

Description of the Related Art

Semiconductor devices included in various kinds of electronic apparatuses are packaged chips covered with a mold resin. The packaged chips are known to be manufactured by dividing a package substrate along planned dividing lines, the package substrate being formed by covering a semiconductor device wafer with a mold resin, or mounting semiconductor device chips in a frame of resin or metal and further covering the device chips with a mold resin (see Japanese Patent Laid-Open No. 2018-206995, for example).

SUMMARY OF THE INVENTION

The package substrate is heated at a time of covering with the mold resin. Thus, when the package substrate is cooled, shrinkage occurs in the mold resin. The package substrate is consequently in a warped state when the package substrate is divided into the packaged chips. Therefore, the package substrate is slightly warped even when the package substrate is held by a chuck table at a time of cutting. However, the package substrate is forcefully sucked by a chuck table, or the package substrate is fixed to a frame by a tape, for example, and the package substrate is divided by what is generally called full cut.

However, in a case where the cross section of the packaged chips is stepped, for example, in a case where packaged chips referred to as a wettable flank are to be formed, a predetermined accuracy is needed for a stepped level difference. Thus, there is a problem in that when a stepped cross section is formed by forming a half cut groove in the warped package substrate, the entire surface of the package substrate cannot be cut to a same depth because the warp is reduced gradually.

Further, there has also been devised a method which measures the height of the package substrate in advance and then forms a stepped cross section while controlling the cutting depth of a cutting blade according to variation in height. However, a problem remains in that the addition of a measuring instrument and a control program become necessary, which results in high cost.

It is accordingly an object of the present invention to provide a package substrate processing method that can suppress the cost of forming a stepped level difference of a predetermined accuracy in the cross section of packaged chips.

In accordance with an aspect of the present invention, there is provided a package substrate processing method for cutting a package substrate in which devices arranged in regions demarcated by a plurality of intersecting planned dividing lines are sealed by resin, the package substrate processing method including a holding step of holding the package substrate by a chuck table, a warp reducing step of, after the holding step is performed, reducing a warp in the package substrate by forming grooves of a first depth along the planned dividing lines of the package substrate by using a first cutting blade, a groove forming step of, after the warp reducing step is performed, forming grooves of a second depth by further cutting the grooves of the first depth by using the first cutting blade, and a dividing step of, after the groove forming step is performed, forming packaged chips by further cutting the grooves of the second depth and thus dividing the package substrate by using a second cutting blade thinner than the first cutting blade.

Preferably, the package substrate includes a metal frame body having a chip mounting region mounted with a device chip and an electrode portion that is disposed on a periphery of the chip mounting region and that protrudes to a planned dividing line, and a mold resin configured to seal the device chip mounted in the metal frame body, and a cut surface of the electrode portion of the packaged chip is formed in a stepped shape by a groove of the second depth.

Preferably, the package substrate processing method further includes a plating step of subjecting the electrode portion to plating processing, between the groove forming step and the dividing step.

According to the present invention, it is possible to suppress the cost of forming a stepped level difference of a predetermined accuracy in the cross section of packaged chips.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will hereinafter be described in detail with reference to the drawings. The present invention is not limited by contents described in the following embodiments. In addition, constituent elements described in the following include constituent elements readily conceivable by those skilled in the art and essentially identical constituent elements. Further, configurations described in the following can be combined with each other as appropriate. In addition, various omissions, replacements, or modifications of configurations can be performed without departing from the spirit of the present invention.

First Embodiment

Figure 1:
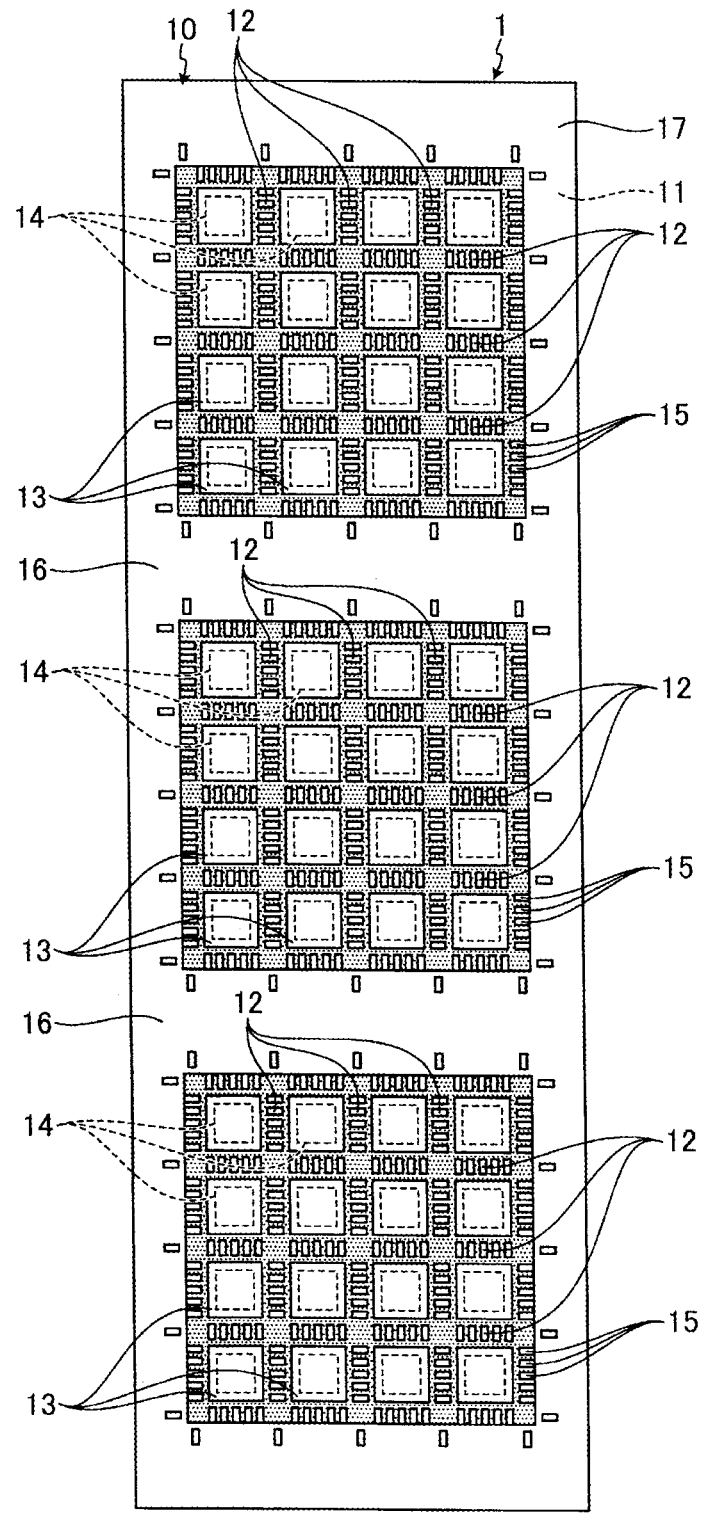
FIG. 1 is a top view depicting a package substrate to be processed by a package substrate processing method according to a first embodiment.
Figure 2:
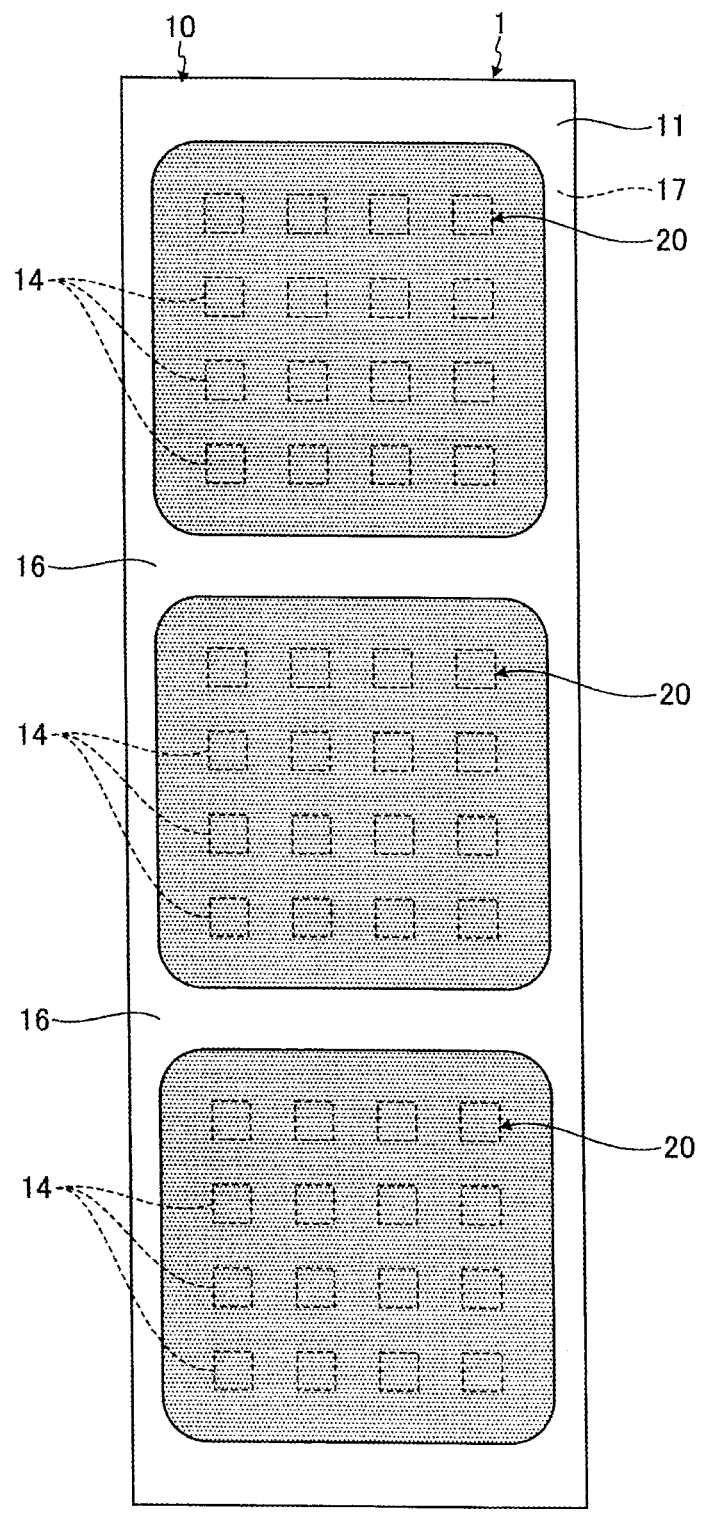
FIG. 2 is a bottom view depicting the package substrate in FIG. 1.
Figure 3:
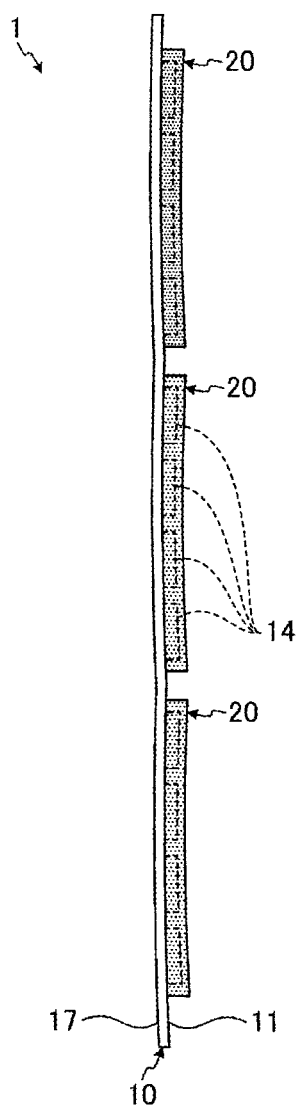
FIG. 3 is a sectional view depicting a cross section along a longitudinal direction of the package substrate in FIG. 1.
Figure 4:
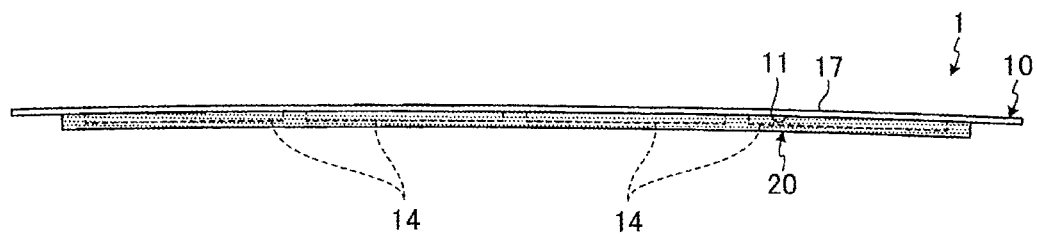
FIG. 4 is a sectional view depicting a cross section along a lateral direction of the package substrate in FIG. 1.
Figure 5:
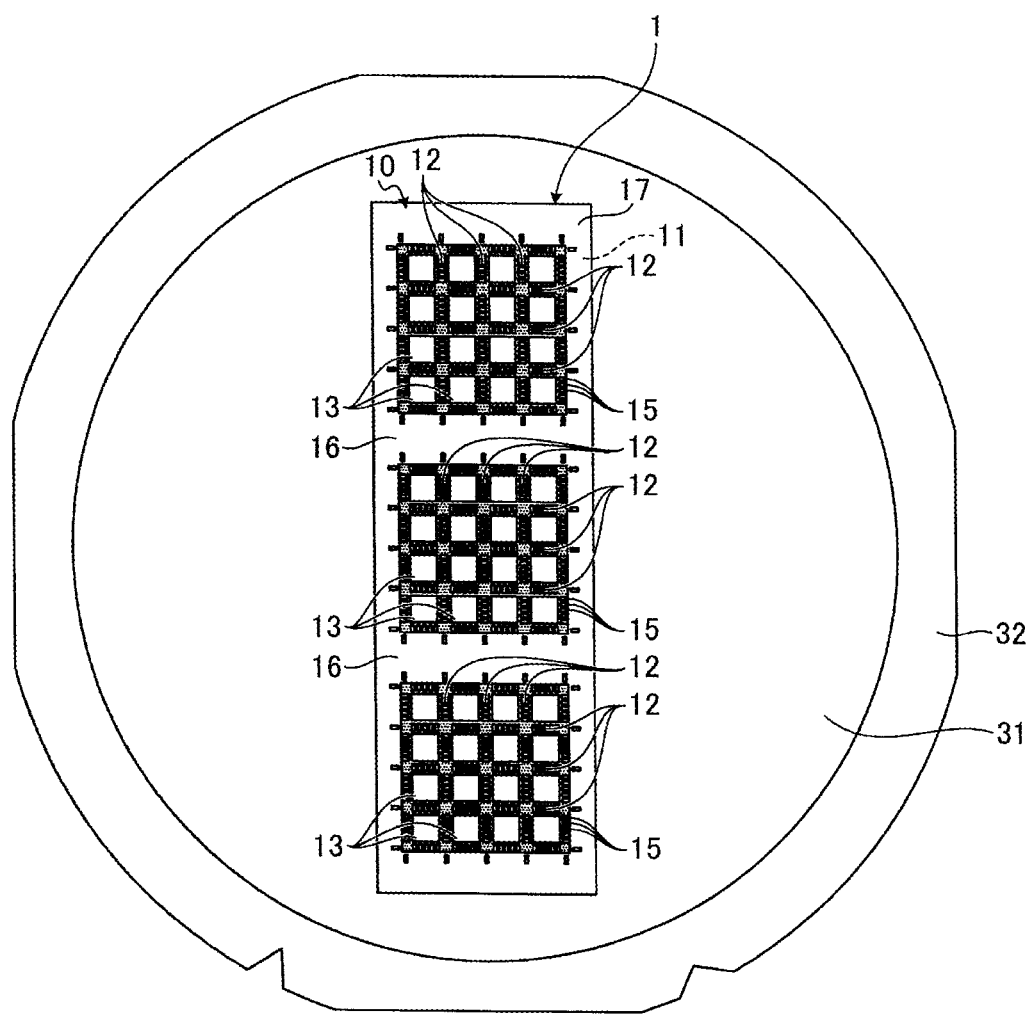
FIG. 5 is a top view depicting a state in which the package substrate in FIG. 1 is supported by an annular frame.
Figure 6:
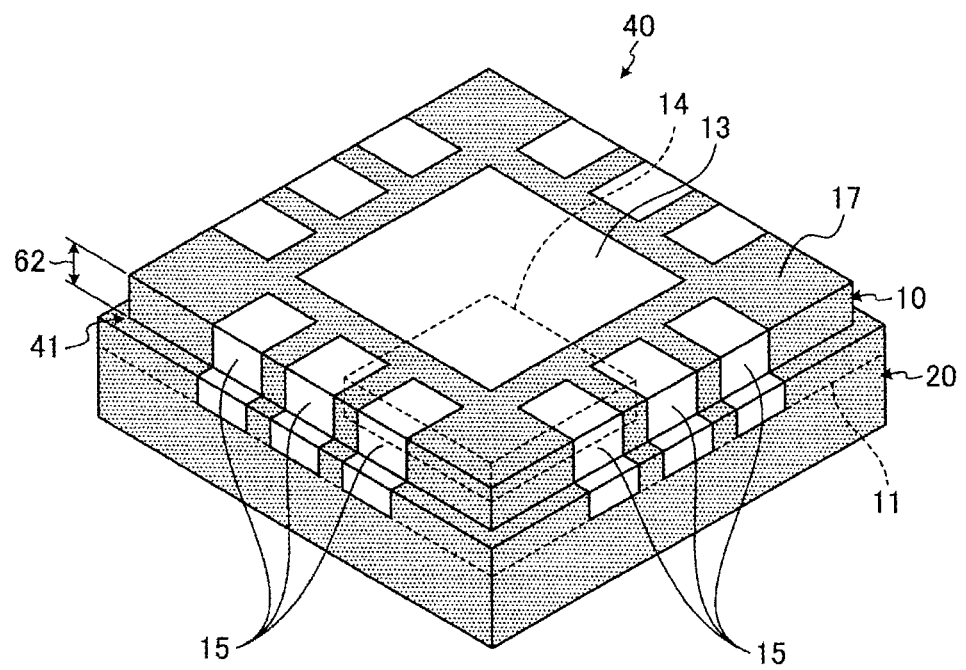
FIG. 6 is a perspective view depicting a packaged chip obtained by dividing the package substrate in FIG. 1.

A package substrate processing method according to a first embodiment of the present invention will be described with reference to the drawings. First, the present specification describes a package substrate 1 to be processed by the package substrate processing method according to the first embodiment with reference to drawings. FIG. 1 is a top view depicting the package substrate 1 to be processed by the package substrate processing method according to the first embodiment. FIG. 2 is a bottom view depicting the package substrate 1 in FIG. 1. FIG. 3 is a sectional view depicting a cross section along a longitudinal direction of the package substrate 1 in FIG. 1. FIG. 4 is a sectional view depicting a cross section along a lateral direction of the package substrate 1 in FIG. 1. FIG. 5 is a top view depicting a state in which the package substrate 1 in FIG. 1 is supported by an annular frame 32. FIG. 6 is a perspective view depicting a packaged chip 40 obtained by dividing the package substrate 1 in FIG. 1.

The package substrate 1 has devices arranged in regions demarcated by a plurality of planned dividing lines formed along a first direction and a second direction intersecting the first direction (orthogonal to the first direction in the first embodiment) on a top surface of the package substrate 1. The devices are sealed with resin. As depicted in FIGS. 1 to 4, the package substrate 1 in the first embodiment includes a metal frame body 10 and a mold resin 20 (an example of resin according to the present invention). The metal frame body 10 is a flat plate that is formed of metal and that has a rectangular planar shape. As depicted in FIG. 1, the package substrate 1 has device chips 14 (an example of devices according to the present invention) arranged in chip mounting regions 13 (an example of regions according to the present invention) demarcated by a plurality of planned dividing lines 12 formed along a longitudinal direction and a lateral direction on a top surface 11 of the metal frame body 10. The mold resin 20 is formed by a thermosetting resin, for example. As depicted in FIGS. 2 to 4, the mold resin 20 seals, on the top surface 11 of the metal frame body 10, the device chips 14 mounted in the chip mounting regions 13 of the metal frame body 10.

In the package substrate 1 in the first embodiment, a plurality of chip mounting regions 13 (16 chip mounting regions 13 in the example depicted in FIG. 1) are arranged in a group in such a manner as to be adjacent to each other with planned dividing lines 12 interposed therebetween. The metal frame body 10 of the package substrate 1 in the first embodiment is a quad-flat non-lead (QFN) package substrate of a leadless structure in which electrode pads are formed as terminals for connection in place of a lead. The metal frame body 10 of the package substrate 1 in the first embodiment includes pluralities of chip mounting regions 13, electrode portions 15 that are arranged on the periphery of each chip mounting region 13 and protrude to the planned dividing lines 12, the electrode portions 15 corresponding to the electrode pads of the QFN package, and a surplus region 16 that surrounds the pluralities of chip mounting regions 13 arranged in groups in such a manner as to be adjacent to each other and that is not mounted with the device chips 14. As depicted in FIG. 1, an electrode portion 15 is formed with a thickness equal to or more than a second depth 62 (see FIG. 6 and the like) to be described later in such a manner as to straddle a planned dividing line 12 from an outer circumferential portion of a device chip 14 mounted in a chip mounting region 13 to a chip mounting region 13 or a surplus region 16 adjacent to the chip mounting region 13 with the planned dividing line 12 interposed therebetween on an undersurface 17 on an side opposite to the top surface 11 of the metal frame body 10. The top surface 11 side of each of the chip mounting regions 13 and the electrode portions 15 of the package substrate 1 is covered by the mold resin 20. The undersurface 17 side of each of the chip mounting regions 13 and the electrode portions 15 of the package substrate 1 is exposed without being covered by the mold resin 20.

The mold resin 20 is formed in such a manner as to cover the top surface 11 side of the pluralities of chip mounting regions 13 arranged in groups in such a manner as to be adjacent to each other. In the package substrate 1 in the example depicted in FIGS. 1 to 4, the groups of the pluralities of chip mounting region 13 are formed at three positions in such a manner as to be arranged in the longitudinal direction, and in correspondence with these groups of the pluralities of chip mounting regions 13, the mold resin 20 is formed at three positions in such a manner as to be arranged in the longitudinal direction.

As depicted in FIG. 3 and FIG. 4, due to a difference in thermal shrinkage between the metal frame body 10 and the mold resin 20, the package substrate 1 has a warp such that the package substrate 1 is curved in a direction of being protruded to the metal frame body 10 side and recessed to the mold resin 20 side as viewed from a side.

In the first embodiment, as depicted in FIG. 5, the package substrate 1 is supported by a dicing tape 31 in the opening of the annular frame 32 in a state in which the undersurface 17 side is exposed, by affixing the dicing tape 31 to the top surface 11 side on which the mold resin 20 is formed and affixing the outer edge of the dicing tape 31 to the annular frame 32.

The package substrate processing method to be described later divides the package substrate 1 into packaged chips 40, one of which is depicted in FIG. 6, by cutting central parts in the width direction of grooves (see FIG. 12 and FIG. 13) after forming the grooves 52 of the second depth 62 along the planned dividing lines 12 of the respective chip mounting regions 13. The packaged chip 40 is a QFN packaged chip. As depicted in FIG. 6, a chip mounting region 13 mounted with a device chip 14 is disposed in the center of the packaged chip 40, and electrode portions 15 corresponding to electrode pads of the QFN packaged chip are disposed on an outer edge portion of the packaged chip 40. The electrode portions 15 of the packaged chip 40 are, for example, fixed to a wiring board such as a printed board via solder. The grooves 52 of the second depth 62 form a stepped portion 41 of the second depth 62 from the undersurface 17 over the whole circumference of the outer edge portion of the packaged chip 40. The outer edge portion including cut surfaces of the electrode portions 15 is thus formed stepwise. The packaged chip 40 thereby increases the contact area of the solder on the electrode portions 15.

Figure 7:
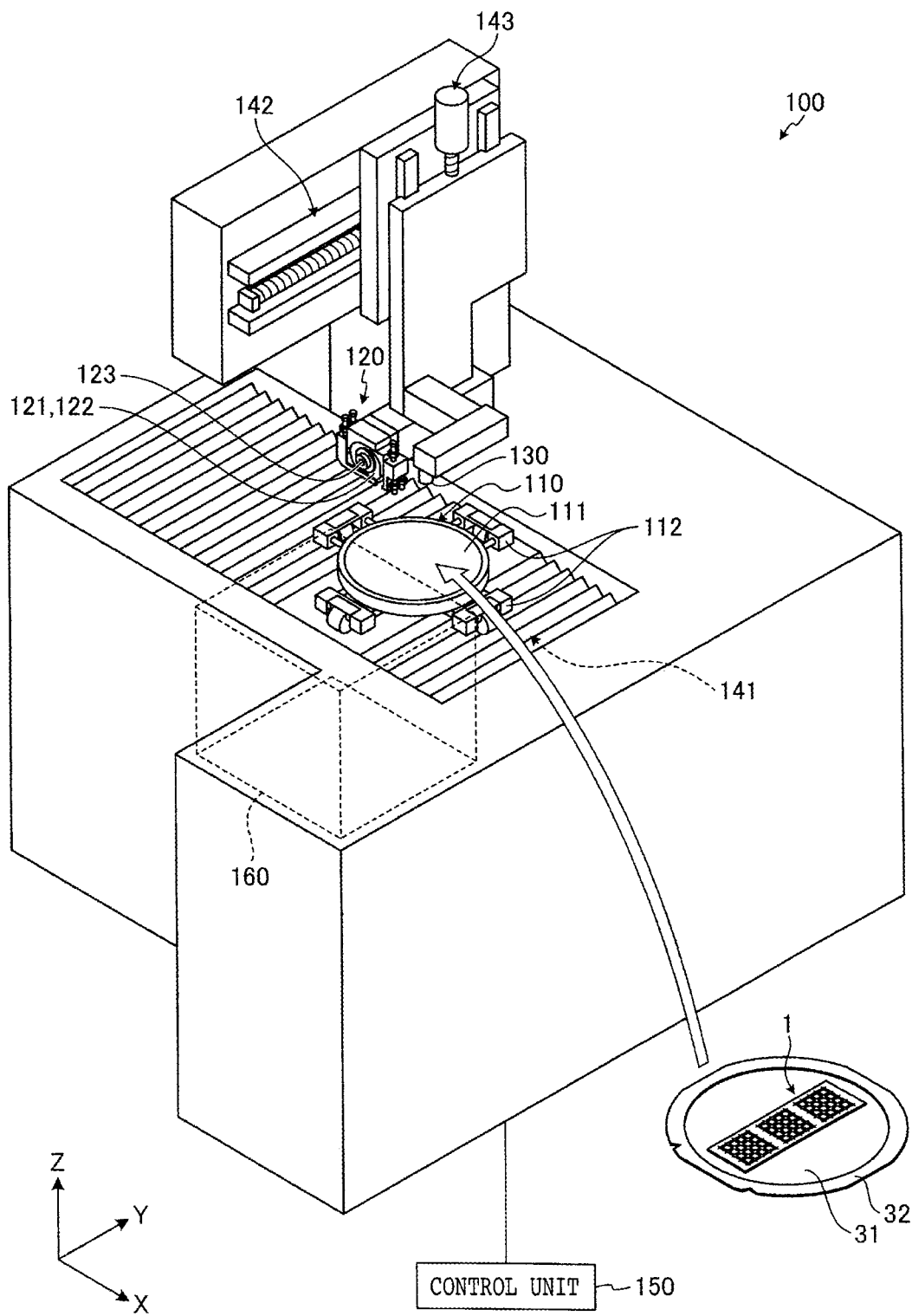
FIG. 7 is a perspective view depicting an example of a configuration of a processing apparatus that performs the package substrate processing method according to the first embodiment.

The present specification next describes, with reference to drawings, a processing apparatus 100 that performs the package substrate processing method according to the first embodiment. FIG. 7 is a perspective view depicting an example of a configuration of the processing apparatus 100 that performs the package substrate processing method according to the first embodiment. As depicted in FIG. 7, the processing apparatus 100 includes a chuck table 110, a processing unit 120, an imaging unit 130, an X-axis moving unit 141, a Y-axis moving unit 142, a Z-axis moving unit 143, and a control unit 150.

The chuck table 110 includes a disk-shaped frame body having a recessed portion formed therein and a disk-shaped suction portion fitted within the recessed portion. The suction portion of the chuck table 110 is formed of a porous ceramic in a porous form or the like. The suction portion is connected to a vacuum suction source not depicted via a vacuum suction path not depicted. The upper surface of the suction portion of the chuck table 110 is a holding surface 111 on which the package substrate 1 is mounted and which holds the mounted package substrate 1 under suction. In the first embodiment, the package substrate 1 is mounted on the holding surface 111 with the undersurface 17 of the package substrate 1 oriented upward, and the holding surface 111 holds the mounted package substrate 1 under suction from the top surface 11 side via the dicing tape 31. The holding surface 111 and the upper surface of the frame body of the chuck table 110 are arranged on a same plane, and are formed in parallel with an XY plane as a horizontal plane. The chuck table 110 is provided in such a manner as to be movable by the X-axis moving unit 141 in an X-axis direction as one direction in a horizontal direction and in such a manner as to be rotatable by a rotational driving source not depicted about an axis parallel with a Z-axis direction which is a vertical direction and is perpendicular to the holding surface 111.

In addition, as depicted in FIG. 7, the chuck table 110 has clamps 112 as four frame holding units that are arranged in a peripheral portion of the frame body and hold and fix the annular frame 32 affixed to the package substrate 1 via the dicing tape 31.

As depicted in FIG. 7, the processing unit 120 includes a first cutting blade 121, a second cutting blade 122, and a spindle 123. The first cutting blade 121 and the second cutting blade 122 are each detachably and replaceably fitted to a distal end of the spindle 123. The spindle 123 applies a rotating action about an axis parallel with a Y-axis direction, which is another direction in the horizontal direction and is orthogonal to the X-axis direction, to each of the first cutting blade 121 and the second cutting blade 122. The first cutting blade 121 and the second cutting blade 122 thereby cut the package substrate 1 held on the chuck table 110. The processing unit 120 is provided in such a manner as to be movable by the Y-axis moving unit 142 in the Y-axis direction with respect to the package substrate 1 held on the chuck table 110, and is provided in such a manner as to be movable by the Z-axis moving unit 143 in the Z-axis direction with respect to the package substrate 1 held on the chuck table 110.

The first cutting blade 121 and the second cutting blade 122 in the first embodiment have an annular cutting edge formed with a first thickness 126 (see FIG. 10 and FIG. 12) and an annular cutting edge formed with a second thickness 127 (see FIG. 15), respectively. The cutting edge of the second cutting blade 122 is thinner than the cutting edge of the first cutting blade 121. That is, the second thickness 127 is smaller than the first thickness 126.

The first cutting blade 121 and the second cutting blade 122 in the first embodiment, for example, have a cutting edge of what is generally called a metal bond type blade formed of abrasive grains such as diamond or cubic boron nitride (CBN) and a bonding material (binder) such as metal or resin. The first cutting blade 121 and the second cutting blade 122 may be a hub blade having a hub, or may be a hubless blade not having a hub. The first cutting blade 121 and the second cutting blade 122 in the present invention are not limited to this. The first cutting blade 121 and the second cutting blade 122 may have a cutting edge of an electroformed bond type blade in which abrasive grains are fixed to a plating layer, or may have a cutting edge of a saw blade-shaped metal saw formed by a thin steel plate blade made of hard metal obtained by sintering a high-speed steel, tungsten carbide, cobalt, nickel, or the like.

The processing apparatus 100 sets the first cutting blade 121 or the second cutting blade 122 fitted to the distal end of the spindle 123 to a predetermined position by the X-axis moving unit 141, the Y-axis moving unit 142, and the Z-axis moving unit 143 with respect to the package substrate 1 held on the chuck table 110, and the processing apparatus 100 cuts the package substrate 1 along the planned dividing lines 12 by the first cutting blade 121 or the second cutting blade 122 fitted to the distal end of the spindle 123 along the planned dividing lines 12 by moving the first cutting blade 121 or the second cutting blade 122 fitted to the distal end of the spindle 123 relative to the package substrate 1 while rotating the first cutting blade 121 or the second cutting blade 122.

The imaging unit 130 in the first embodiment is fixed to the processing unit 120 in such a manner as to move integrally with the processing unit 120. The imaging unit 130 includes an imaging element that images the undersurface 17 (exposed surface) and the planned dividing lines 12 of the package substrate 1 that is held on the chuck table 110 and that has not yet undergone cutting processing. The imaging element is, for example, a charge-coupled device (CCD) imaging element or a complementary metal oxide semiconductor (CMOS) imaging element. The imaging unit 130 images the undersurface 17 and the like of the package substrate 1 that is held on the chuck table 110 and that has not yet undergone cutting processing, thereby obtains an image, for example, for carrying out an alignment that aligns the package substrate 1 with the first cutting blade 121 or the second cutting blade 122 fitted to the distal end of the spindle 123, and outputs the obtained image to the control unit 150.

The control unit 150 makes the processing apparatus 100 perform the package substrate processing method according to the first embodiment by controlling the operation of various constituent elements of the processing apparatus 100. The control unit 150 in the present embodiment includes a computer system. The computer system included in the control unit 150 includes an arithmetic processing device including a microprocessor such as a central processing unit (CPU), a storage device including a memory such as a read only memory (ROM) or a random access memory (RAM), and an input-output interface device. The arithmetic processing device of the control unit 150 performs arithmetic processing according to a computer program stored in the storage device of the control unit 150, and outputs a control signal for controlling the processing apparatus 100 to each constituent element of the processing apparatus 100 via the input-output interface device of the control unit 150.

The processing apparatus 100 further includes a cassette mounting base 160, a cleaning unit not depicted, and a transporting unit not depicted. The cassette mounting base 160 is a mounting base for mounting a cassette as a container for housing a plurality of package substrates 1. The cassette mounting base 160 raises and lowers the mounted cassette in the Z-axis direction. The cleaning unit cleans the package substrate 1 that has undergone cutting processing, and thereby removes foreign matter such as cutting waste adhering to the package substrate 1. The transporting unit not depicted transports a package substrate 1 that has not yet undergone cutting processing from the inside of the cassette onto the chuck table 110, transports the package substrate 1 that has undergone the cutting processing from the chuck table 110 to the cleaning unit, and transports the package substrate 1 after being cleaned from the cleaning unit to the inside of the cassette.

Figure 8:
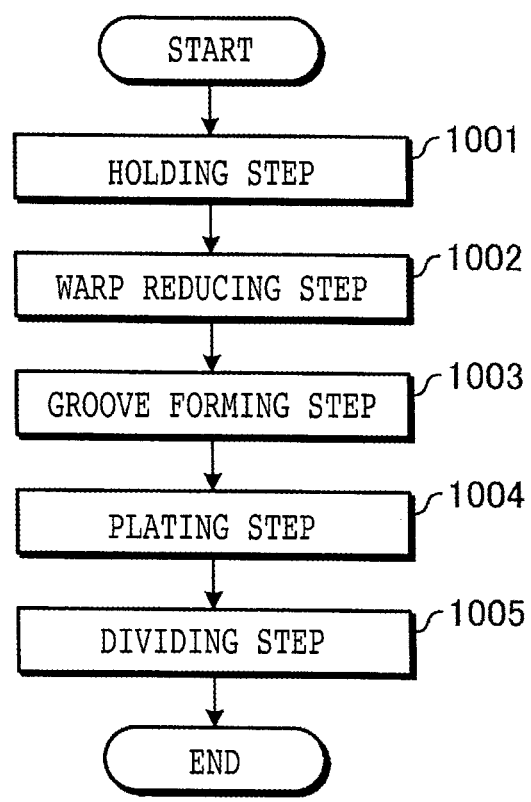
FIG. 8 is a flowchart illustrating an example of a processing procedure of the package substrate processing method according to the first embodiment.
Figure 9:
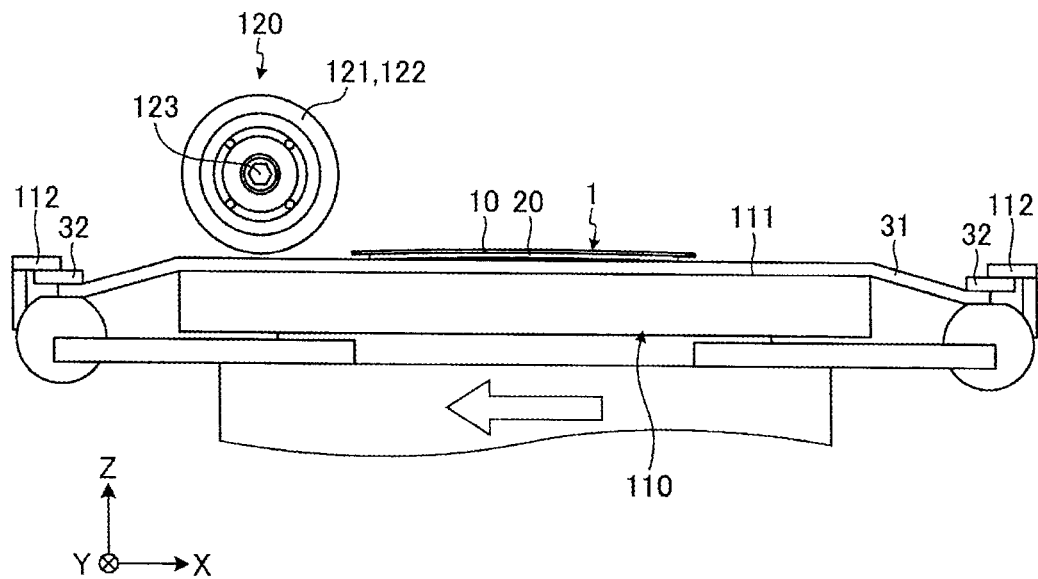
FIG. 9 is a sectional view of assistance in explaining a holding step in FIG. 8.
Figure 10:
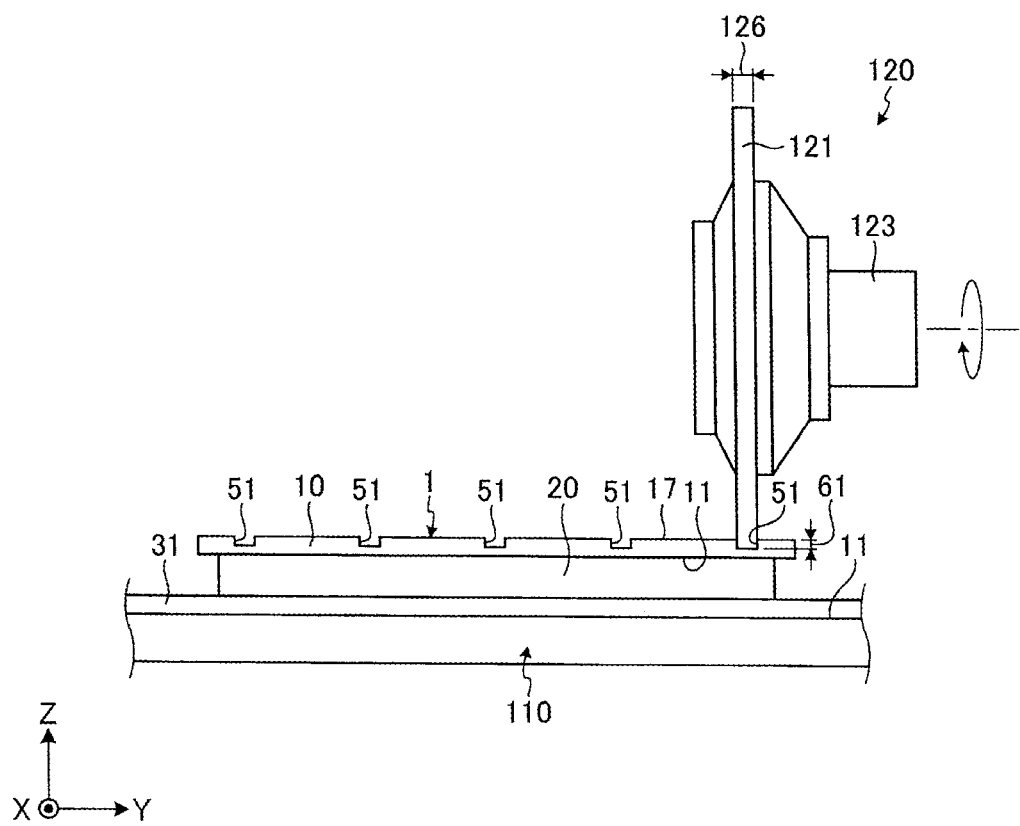
FIG. 10 is a sectional view of assistance in explaining a warp reducing step in FIG. 8.
Figure 11:
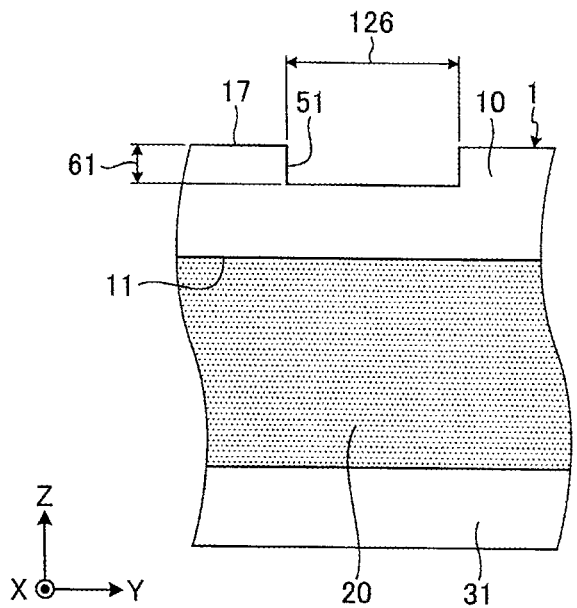
FIG. 11 is an enlarged sectional view depicting the package substrate that has undergone the warp reducing step in FIG. 8.
Figure 12:
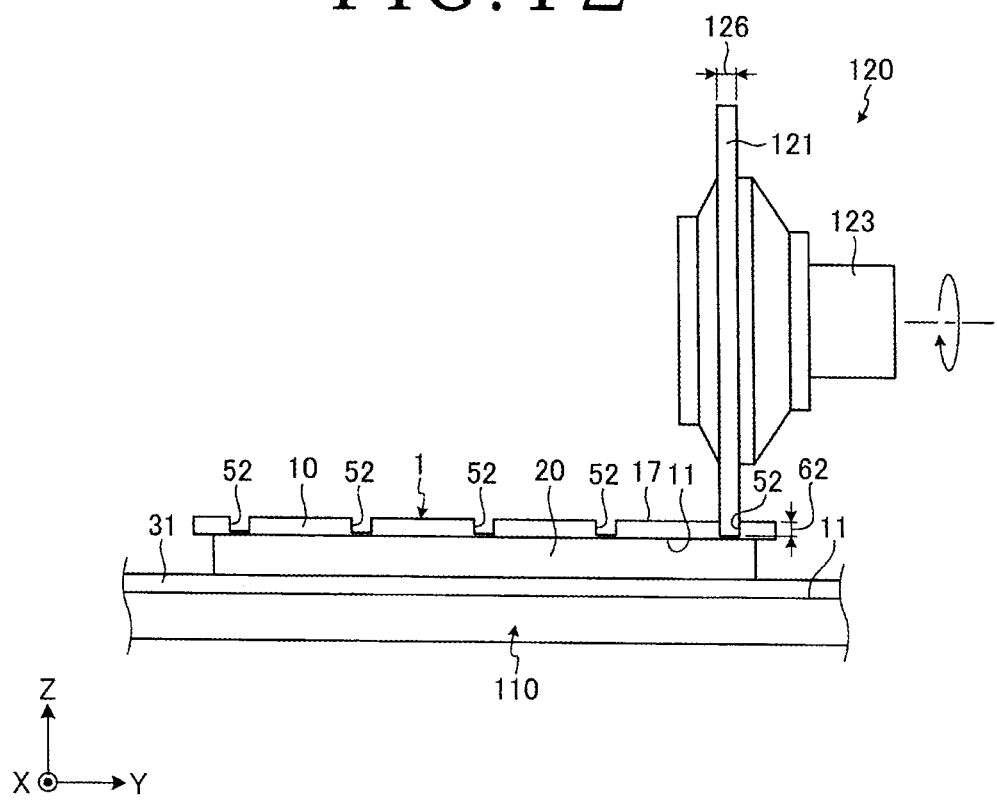
FIG. 12 is a sectional view of assistance in explaining a groove forming step in FIG. 8.
Figure 13:
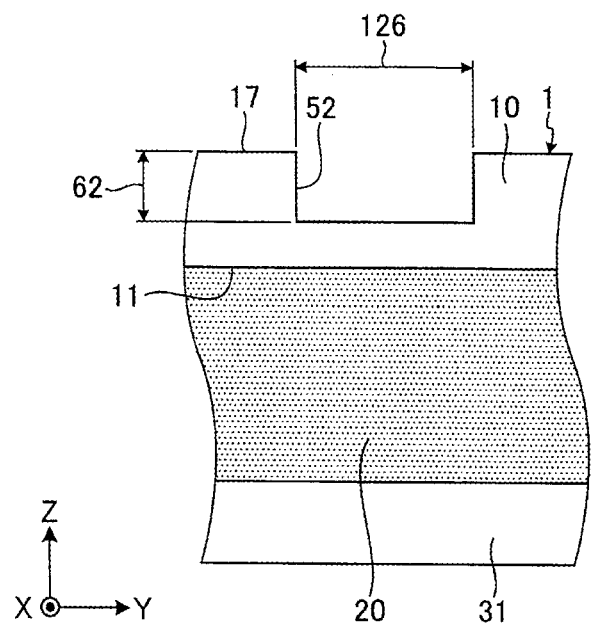
FIG. 13 is an enlarged sectional view depicting the package substrate that has undergone the groove forming step in FIG. 8.
Figure 14:
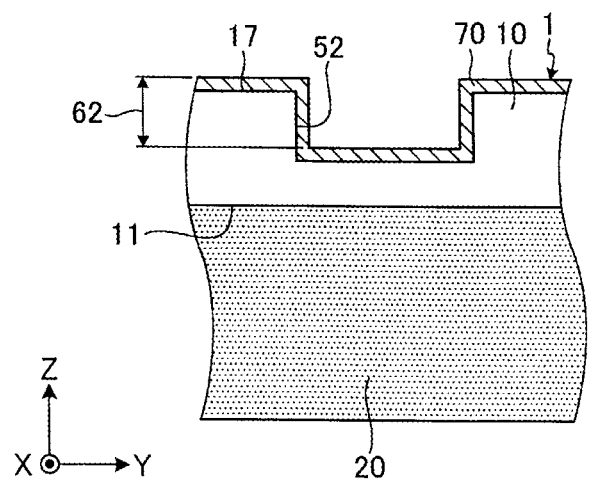
FIG. 14 is an enlarged sectional view of assistance in explaining a plating step in FIG. 8.
Figure 15:
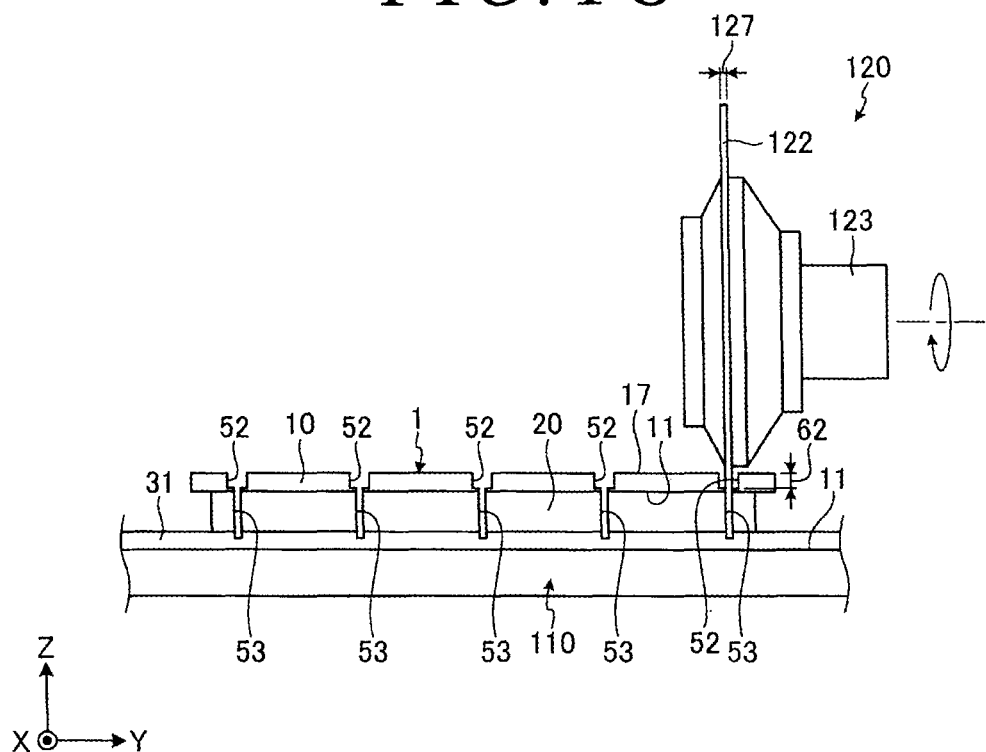
FIG. 15 is a sectional view of assistance in explaining a dividing step in FIG. 8.
Figure 16:
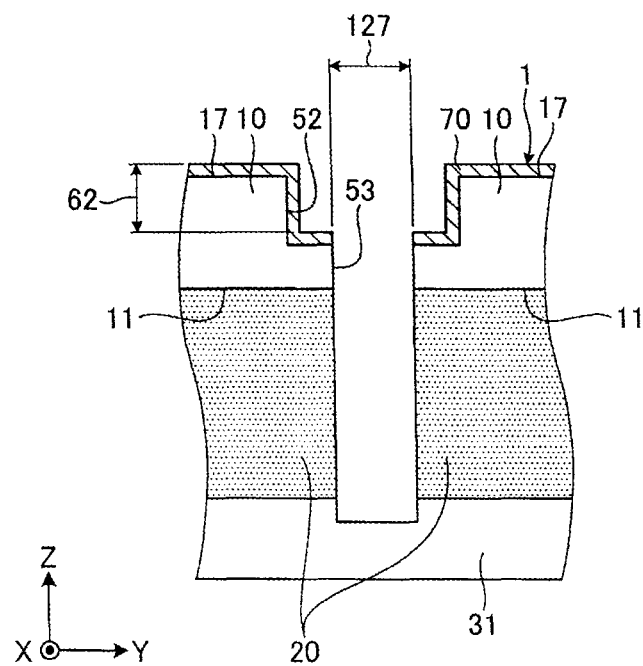
FIG. 16 is an enlarged sectional view depicting the package substrate that has undergone the dividing step in FIG. 8.

The present specification next describes the package substrate processing method according to the first embodiment with reference to drawings. FIG. 8 is a flowchart illustrating an example of a processing procedure of the package substrate processing method according to the first embodiment. FIG. 9 is a sectional view of assistance in explaining a holding step 1001 in FIG. 8. FIG. 10 is a sectional view of assistance in explaining a warp reducing step 1002 in FIG. 8. FIG. 11 is an enlarged sectional view depicting the package substrate 1 that has undergone the warp reducing step 1002 in FIG. 8. FIG. 12 is a sectional view of assistance in explaining a groove forming step 1003 in FIG. 8. FIG. 13 is an enlarged sectional view depicting the package substrate 1 that has undergone the groove forming step 1003 in FIG. 8. FIG. 14 is an enlarged sectional view of assistance in explaining a plating step 1004 in FIG. 8. FIG. 15 is a sectional view of assistance in explaining a dividing step 1005 in FIG. 8. FIG. 16 is an enlarged sectional view depicting the package substrate 1 that has undergone the dividing step 1005 in FIG. 8. The package substrate processing method according to the first embodiment is an example of operation processing performed by the processing apparatus 100. As depicted in FIG. 8, the package substrate processing method according to the first embodiment includes the holding step 1001, the warp reducing step 1002, the groove forming step 1003, the plating step 1004, and the dividing step 1005.

As depicted in FIG. 9, the holding step 1001 is a step of holding the package substrate 1 by the chuck table 110. In the holding step 1001, first, as depicted in FIG. 5, the package substrate 1 is supported by the dicing tape 31 in the opening of the annular frame 32 in a state in which the undersurface 17 side is exposed, by affixing the dicing tape 31 to the top surface 11 side of the package substrate 1 and affixing the annular frame 32 to the outer edge of the dicing tape 31. In the holding step 1001, next, the control unit 150 mounts, by the transporting unit, the package substrate 1 supported by the dicing tape 31 in the opening of the annular frame 32 onto the holding surface 111 of the chuck table 110 with the undersurface 17 oriented upward, and holds under suction, by the chuck table 110, the package substrate 1 mounted on the holding surface 111, from the top surface 11 side via the dicing tape 31, and holds, by the clamps 112, the annular frame 32 affixed to the package substrate 1 via the dicing tape 31.

The warp reducing step 1002 is performed after the execution of the holding step 1001. As depicted in FIG. 10 and FIG. 11, the warp reducing step 1002 is a step of forming grooves 51 of a first depth 61 along the planned dividing lines 12 of the package substrate 1 by using the first cutting blade 121, and thereby reducing a warp in the package substrate 1. In the warp reducing step 1002, first, the first cutting blade 121 is fitted to the distal end of the spindle 123. In the warp reducing step 1002, next, the control unit 150 cuts the package substrate 1 from the undersurface 17 side along the planned dividing lines 12 by the first cutting blade 121 by moving the first cutting blade 121 relative to the package substrate 1 along the planned dividing lines 12 while rotating the first cutting blade 121. The control unit 150 thereby forms the grooves 51 of the first depth 61 and a width corresponding to the first thickness 126 along the planned dividing lines 12 of the package substrate 1. By thus forming the grooves 51 of the first depth 61 along the planned dividing lines 12 of the package substrate 1, the warp reducing step 1002 reduces a difference in shearing stress which difference has occurred between the metal frame body 10 and the mold resin 20 due to a difference in thermal shrinkage between the metal frame body 10 and the mold resin 20. The warp reducing step 1002 thus reduces the warp in the package substrate 1.

The first depth 61 of the grooves 51 is set to a given value smaller than the second depth 62 of the grooves 52 to be formed in the groove forming step 1003 to be described later. The first depth 61 of the grooves 51 is preferably set to a value capable of fully executing the function of reducing the warp in the package substrate 1 (for example, reducing the warp to 50% or less) and sufficiently smaller than the second depth 62 of the grooves 52 (for example, 70% or less of the second depth 62).

The warp reducing step 1002 in the first embodiment forms the grooves 51 of the first depth 61 along all of the planned dividing lines 12 of the package substrate 1. However, the warp reducing step 1002 in the present invention is not limited to this. Grooves 51 of the first depth 61 may be formed only along some of the plurality of planned dividing lines 12 that are selected in advance. As a result of forming the grooves 51 of the first depth 61 along the plurality of planned dividing lines 12 in the warp reducing step 1002, when a groove 52 of the second depth 62 is formed by further cutting a groove 51 of the first depth 61 in the groove forming step 1003 to be performed subsequently, at least one of the remaining grooves 51 executes the function of reducing the warp in the package substrate 1.

In addition, the warp reducing step 1002 may, for example, form grooves 51 of the first depth 61 only along the planned dividing lines 12 formed along the first direction (longitudinal direction), or may form grooves 51 of the first depth 61 only along the planned dividing lines 12 formed along the second direction (lateral direction). Further, the warp reducing step 1002 may, for example, form grooves 51 of the first depth 61 only along some of the planned dividing lines 12 that are selected in advance among the planned dividing lines 12 formed along the first direction (longitudinal direction), or may form grooves 51 of the first depth 61 only along some of the planned dividing lines 12 that are selected in advance among the planned dividing lines 12 formed along the second direction (lateral direction). In the warp reducing step 1002, the planned dividing lines 12 in which to form the grooves 51 of the first depth 61 can be changed as appropriate according to the warp in the package substrate 1.

The groove forming step 1003 is performed after the execution of the warp reducing step 1002. As depicted in FIG. 12 and FIG. 13, the groove forming step 1003 is a step of further cutting the grooves 51 of the first depth 61 by using the first cutting blade 121, and thereby forming grooves 52 of the second depth 62 deeper than the first depth 61. The groove forming step 1003 is performed in a state in which the first cutting blade 121 remains fitted to the distal end of the spindle 123 following the warp reducing step 1002. In the warp reducing step 1002, the control unit 150 cuts the package substrate 1 from the undersurface 17 side along the planned dividing lines 12 by the first cutting blade 121 by moving the first cutting blade 121 relative to the package substrate 1 along the planned dividing lines 12 while rotating the first cutting blade 121. The control unit 150 thereby forms the grooves 52 of the second depth 62 and the width corresponding to the first thickness 126 along the planned dividing lines 12 of the package substrate 1. Incidentally, the second depth 62 of the grooves 52 is set to the same value as that of a desired depth of the stepped portion 41 formed in the outer edge portion of the packaged chip 40. In the groove forming step 1003, before the formation of a groove 52, the position of the cutting blade 121 is adjusted such that the center of the thickness of the cutting blade 121 is located at the center in the width direction of a groove 51. The position of the cutting blade 121 is thus adjusted such that no stepped level difference is formed on the side surfaces of the groove 52.

The groove forming step 1003 in the first embodiment forms the grooves 52 of the second depth 62 by performing the cutting along all of the planned dividing lines 12. In addition, in the groove forming step 1003, in a case where the grooves 51 of the first depth 61 are formed only along some of the plurality of planned dividing lines 12 selected in advance in the warp reducing step 1002, the grooves 52 of the second depth 62 are formed by performing the cutting also along the planned dividing lines 12 in which the grooves 51 of the first depth 61 are not formed.

The plating step 1004 is performed between the groove forming step 1003 and the dividing step 1005. As depicted in FIG. 14, the plating step 1004 is a step of subjecting the electrode portion 15 to plating processing. The plating step 1004, for example, immerses the package substrate 1, which has undergone the groove forming step 1003 but has not yet undergone the dividing step 1005, in an electroplating bath for a predetermined time with a predetermined voltage applied to the electrode portions 15. The plating step 1004 thereby forms a plating film 70 of metal such as nickel on the exposed portions of the electrode portions 15. Here, the exposed portions of the electrode portions 15 are parts of the electrode portions 15 which parts are exposed on the undersurface 17 of the metal frame body 10 and the side surfaces and bottom surfaces of the grooves 52. It is to be noted that while the plating step 1004 is performed in the first embodiment, the present invention is not limited to this, and the plating step 1004 may be omitted.

The dividing step 1005 is a step of further cutting the grooves 52 of the second depth 62 by using the second cutting blade 122 thinner than the first cutting blade 121, as depicted in FIG. 15 and FIG. 16, thereby dividing the package substrate 1, and thus forming packaged chips 40, at least after the execution of the groove forming step 1003, or after the execution of the plating step 1004 in the first embodiment. In the dividing step 1005, first, the second cutting blade 122 is fitted to the distal end of the spindle 123. In the dividing step 1005, next, the control unit 150 cuts the package substrate 1 from the undersurface 17 side along the planned dividing lines 12 by the second cutting blade 122 by moving the second cutting blade 122 relative to the package substrate 1 along the planned dividing lines 12 while rotating the second cutting blade 122. The control unit 150 thereby cuts central parts in the width direction of the grooves 52 of the second depth 62 and the width corresponding to the first thickness 126 which grooves are formed in the groove forming step 1003. The control unit 150 thus forms grooves 53 that has a depth reaching the top surface 11 of the package substrate 1 from the undersurface 17 and that has a width corresponding to the second thickness 127. The dividing step 1005 in the first embodiment forms the grooves 53 by performing the cutting along all of the planned dividing lines 12. By forming such grooves 53 along the planned dividing lines 12 of the package substrate 1, the dividing step 1005 divides the package substrate 1 along the planned dividing lines 12, and thus forms packaged chips 40.

The package substrate processing method according to the first embodiment having the configuration as described above reduces the warp in the package substrate 1 by forming the shallow grooves 51 in advance by the first cutting blade 121 having a thickness for forming a stepped cross section, and forms the grooves 52 of a desired depth (second depth 62) by using the same first cutting blade 121. Therefore, the package substrate processing method according to the first embodiment can form the grooves 52 of the desired depth in the entire surface of the package substrate 1 after reducing the effect of the warp in the package substrate 1 without using a measuring instrument, a special control program, or the like. The package substrate processing method according to the first embodiment consequently produces an effect of being able to reduce the cost of forming the stepped portion 41 in a shape of a step with predetermined accuracy in the cross section of the packaged chip 40 obtained by dividing the package substrate 1. In addition, the package substrate processing method according to the first embodiment can successively perform the warp reducing step 1002 of forming the shallow grooves 51 and the groove forming step 1003 of forming the grooves 52 of the desired depth by using the same first cutting blade 121 in one processing apparatus 100.

In addition, the package substrate processing method according to the first embodiment exerts the above-described effects particularly noticeably in a case where the package substrate 1 has a warp due to a difference in thermal shrinkage between the metal frame body 10 and the mold resin 20 because the package substrate 1 has the metal frame body 10 and the mold resin 20 and where the stepped portion 41 in a shape of a step needs to be formed with predetermined accuracy in the cross section of the packaged chip 40 obtained by dividing the package substrate 1 because the package substrate 1 is a QFN package substrate of a leadless structure. Thus, the electrode portions 15 of the packaged chip 40 can be fixed to a wiring board such as a printed board via solder with predetermined accuracy and at low cost.

In addition, the package substrate processing method according to the first embodiment includes the plating step 1004 of subjecting the electrode portions 15 to plating processing, between the groove forming step 1003 and the dividing step 1005. The plating film 70 formed by the plating processing consequently improves the wettability of solder of the electrode portions 15 of the packaged chip 40. Thus, the package substrate processing method according to the first embodiment can further improve the accuracy of fixing the electrode portions 15 of the packaged chip 40 to the wiring board such as the printed board via solder.

Second Embodiment

Figure 17:
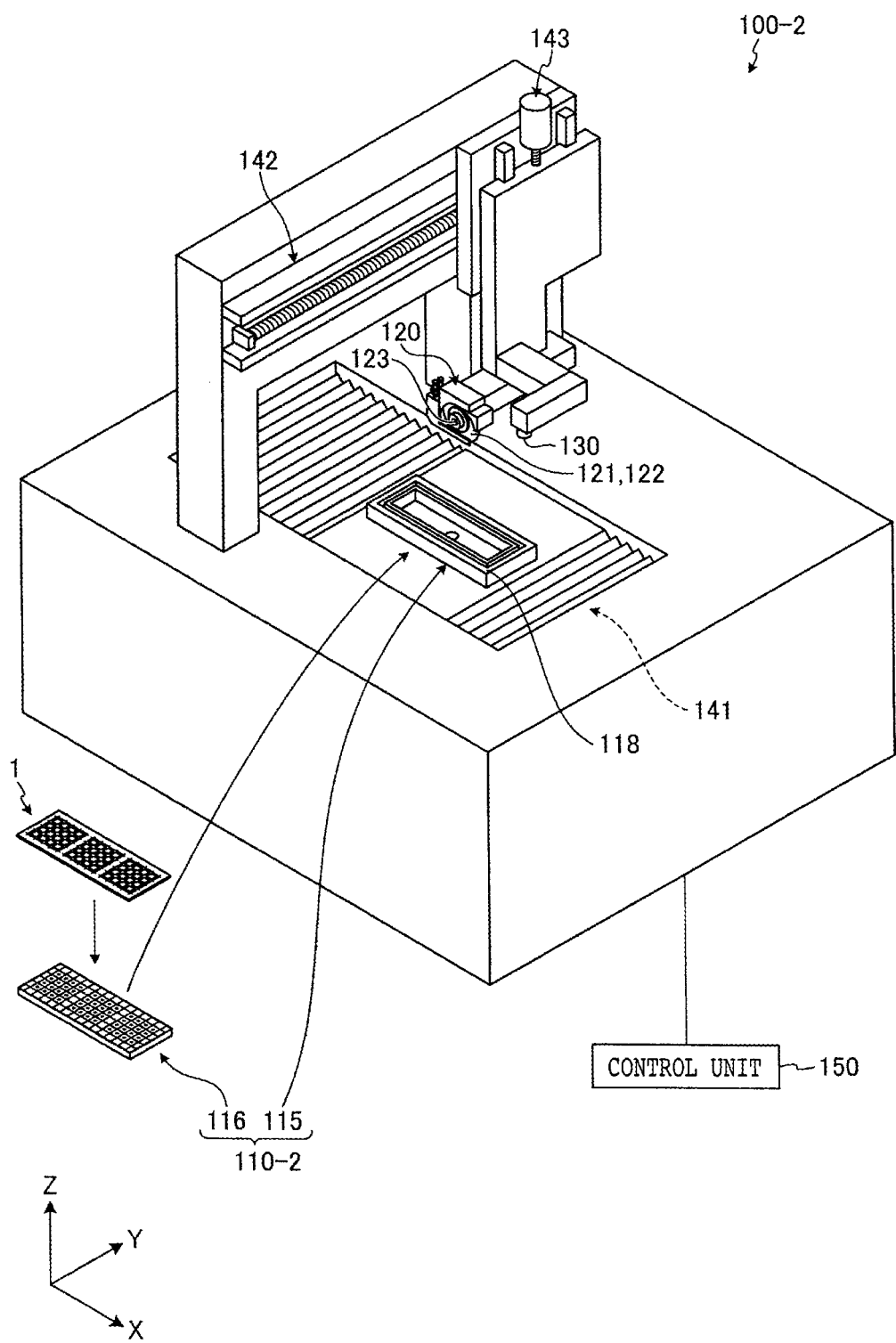
FIG. 17 is a perspective view depicting an example of a configuration of a processing apparatus that performs a package substrate processing method according to a second embodiment.

A package substrate processing method according to a second embodiment of the present invention will be described with reference to drawings. FIG. 17 is a perspective view depicting an example of a configuration of a processing apparatus 100-2 that performs the package substrate processing method according to the second embodiment. In FIG. 17, the same parts as in the first embodiment are identified by the same reference numerals, and description will be omitted.

The present specification first describes the processing apparatus 100-2 that performs the package substrate processing method according to the second embodiment with reference to drawings. As depicted in FIG. 17, the processing apparatus 100-2 is obtained by changing the chuck table 110 to a chuck table 110-2 in the processing apparatus 100 according to the first embodiment, and the other configurations of the processing apparatus 100-2 are substantially the same as in the processing apparatus 100 according to the first embodiment. The chuck table 110-2 is what is generally called a jig chuck table in which a jig on an upper surface side (holding surface side) for holding the package substrate 1 is changed in such a manner as to correspond to the package substrate 1. As depicted in FIG. 17, the chuck table 110-2 includes a table base 115 and a holding plate 116 corresponding to the jig. The holding plate 116 corresponding to the package substrate 1 is detachably fitted to an upper surface 118 of the table base 115.

The table base 115 is coupled to a rotational driving source not depicted, and is provided in such a manner as to be rotatable about a Z-axis by the rotational driving source not depicted. As with the chuck table 110, the table base 115 is provided in such a manner as to be movable in the X-axis direction by the X-axis moving unit 141 and in such a manner as to be rotatable about an axis parallel with the Z-axis direction by the rotational driving source not depicted.

The holding plate 116 is a flat plate-shaped member (holding member) having a rectangular shape corresponding to the package substrate 1 as viewed in plan. A surface for holding the package substrate 1 under suction is formed as an upper surface of the holding plate 116. A lower surface side of the holding plate 116 is formed in such a manner as to be able to be detachably fitted to the table base 115. When the lower surface side of the holding plate 116 is fitted to the table base 115, the upper surface of the holding plate 116 becomes parallel with an XY plane as a horizontal plane, and becomes a holding surface that holds the package substrate 1. The holding plate 116 in the second embodiment is, for example, formed by covering the top surface of a plate-shaped object formed of metal such as steel use stainless (SUS), the top surface being on a side serving as the holding surface, with urethane rubber or the like such as nitrile rubber or ethylene rubber.

As depicted in FIG. 17, the holding plate 116 has, on the upper surface side, a plurality of grooves formed at positions corresponding to the planned dividing lines 12 of the package substrate 1. These grooves are clearance grooves into which to insert the second cutting blade 122 that cuts the planned dividing lines 12 of the package substrate 1. The grooves are formed in such a manner as to have a width wider than the width of the planned dividing lines 12 of the package substrate 1 and the thickness of the second cutting blade 122 and have a depth deeper than the cutting depth of the second cutting blade 122. The holding plate 116 is divided by the plurality of grooves into a plurality of regions corresponding to the respective chip mounting regions 13 of the package substrate 1 that has been divided along the plurality of planned dividing lines 12.

As depicted in FIG. 17, the holding plate 116 has a plurality of suction holes, a predetermined number (one in the example depicted in FIG. 17) of which are formed in each of the regions corresponding to the plurality of chip mounting regions 13 of the package substrate 1. The plurality of suction holes are each made to communicate with a suction source not depicted via a suction passage formed within the table base 115 and a suction valve not depicted. A negative pressure from the suction source is introduced from the plurality of suction holes to the upper surface side of the holding plate 116 via the suction passage and the suction valve. The holding plate 116 thereby holds under suction each of the plurality of chip mounting regions 13 of the package substrate 1 from the top surface 11 side with the undersurface 17 oriented upward.

The present specification next describes the package substrate processing method according to the second embodiment with reference to drawings. The package substrate processing method according to the second embodiment is an example of operation processing performed by the processing apparatus 100-2. In the package substrate processing method according to the second embodiment, the holding step 1001 is changed as the chuck table 110 in the first embodiment is changed to the chuck table 110-2. The holding step 1001 according to the second embodiment omits the processing of affixing the dicing tape 31 to the top surface 11 side of the package substrate 1 in the first embodiment. In the holding step 1001 according to the second embodiment, the control unit 150 mounts, by the transporting unit, the package substrate 1 to which the dicing tape 31 is not affixed onto the upper surface of the holding plate 116 fitted to the table base 115 of the chuck table 110-2 with the undersurface 17 oriented upward, and directly holds under suction the package substrate 1 mounted on the upper surface of the holding plate 116 from the top surface 11 side, by the chuck table 110-2.

The package substrate processing method according to the second embodiment having the configuration as described above is obtained by changing the method of holding the package substrate 1 in the first embodiment, and forms the grooves 51, 52, and 53 in a manner similar to that of the first embodiment. The package substrate processing method according to the second embodiment therefore produces actions and effects similar to those of the first embodiment. The package substrate processing method according to the second embodiment further produces an effect of being able to reduce cost involved in the consumption of the dicing tape 31 because the package substrate processing method according to the second embodiment can omit the processing of affixing the dicing tape 31 in order to hold the package substrate 1.

It is to be noted that the present invention is not limited to the foregoing embodiments. That is, the present invention can be variously modified and carried out without departing from the gist of the present invention. For example, the processing apparatus 100 in the present invention may be mounted with two spindles 123 as the processing unit 120. In that case, the first cutting blade 121 or the second cutting blade 122 may be fitted to both of the spindles 123, or the first cutting blade 121 may be fitted to one of the spindles 123 and the second cutting blade 122 may be fitted to the other of the spindles 123.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A package substrate processing method for cutting a package substrate in which devices arranged in regions demarcated by a plurality of intersecting planned dividing lines are sealed by resin, the package substrate processing method comprising:
    a holding step of holding the package substrate by a chuck table;
    a warp reducing step of, after the holding step is performed, reducing a warp in the package substrate by forming grooves of a first depth along the planned dividing lines of the package substrate by using a first cutting blade;
    a groove forming step of, after the warp reducing step is performed, forming grooves of a second depth by further cutting the grooves of the first depth by using the first cutting blade; and
    a dividing step of, after the groove forming step is performed, forming packaged chips by further cutting the grooves of the second depth and thus dividing the package substrate by using a second cutting blade thinner than the first cutting blade.

2. The package substrate processing method according to claim 1, wherein
    the package substrate includes
        a metal frame body having a chip mounting region mounted with a device chip and an electrode portion that is disposed on a periphery of the chip mounting region and that protrudes to a planned dividing line, and
        a mold resin configured to seal the device chip mounted in the metal frame body, and
    a cut surface of the electrode portion of the packaged chip is formed in a stepped shape by a groove of the second depth.

3. The package substrate processing method according to claim 2, further comprising:
    a plating step of subjecting the electrode portion to plating processing, between the groove forming step and the dividing step.

* * * * *